United States Patent

Senda et al.

[11] Patent Number: 5,576,053
[45] Date of Patent: Nov. 19, 1996

[54] METHOD FOR FORMING AN ELECTRODE ON AN ELECTRONIC PART

[75] Inventors: Atsuo Senda; Yoshihiko Takano; Kazuhiro Morita, all of Kyoto-fu, Japan

[73] Assignee: Murata Manufacturing Co., Ltd., Japan

[21] Appl. No.: 395,620

[22] Filed: Feb. 28, 1995

Related U.S. Application Data

[63] Continuation-in-part of Ser. No. 240,274, May 10, 1994, abandoned.

[30] Foreign Application Priority Data

May 11, 1993 [JP] Japan ................. 5-133887

[51] Int. Cl.$^6$ ............................................. B05D 5/12
[52] U.S. Cl. ........................ 427/123; 427/98; 427/301; 427/304; 427/457; 106/1.22; 106/1.25
[58] Field of Search ................... 427/98, 123, 301, 427/304, 305, 443.1, 437, 438; 106/1.05, 1.11, 1.22–1.29; 205/252, 299, 301–304

[56] References Cited

U.S. PATENT DOCUMENTS

| | | | |
|---|---|---|---|
| 3,295,999 | 1/1967 | Klein et al. | 106/1.22 |
| 3,340,073 | 9/1967 | Zirngieble et al. | 106/1.25 |
| 3,663,242 | 5/1972 | Gulla et al. | 106/1.22 |
| 3,689,292 | 9/1972 | Preston | 106/1.25 |
| 3,959,531 | 5/1976 | Schneble, Jr. et al. | 427/345 |
| 4,943,480 | 7/1990 | Itzhak | 106/1.25 |
| 5,160,373 | 11/1992 | Senda et al. | 106/1.29 |
| 5,269,838 | 12/1993 | Inoue et al. | 106/1.22 |
| 5,360,471 | 11/1994 | Takano et al. | 106/1.25 |
| 5,364,459 | 11/1994 | Senda et al. | 106/1.25 |

FOREIGN PATENT DOCUMENTS

| | | |
|---|---|---|
| 6101056 | 4/1994 | Japan . |
| 6264248 | 9/1994 | Japan . |

*Primary Examiner*—Shrive Beck
*Assistant Examiner*—Brian K. Talbot
*Attorney, Agent, or Firm*—Ostrolenk, Faber, Gerb & Soffen, LLP

[57] ABSTRACT

Electrodes are formed on an electronic part by an initial step of forming electrodes on a ceramic substrate, dipping the ceramic substrate in a noble metal solution for activating the surface of the electrodes by the use of a noble metal, and forming a solder layer or a tin layer on the activated surface of the electrode by electroless plating using 3-valence titanium ion as a reducing agent. The electrodes to be formed on the ceramic substrate may be a double layer comprised of a first layer containing silver, silver-palladium, silver-platinum or copper and a second electroless nickel plated layer. In the step of forming a solder layer or a tin layer on the activated surface of the electrode by electroless plating using 3-valence titanium ion a reducing agent, it is preferable to add a metal ion except tin and lead in the plating bath. Preferably, the metal ion added in the plating bath may be alkali earth metal element or may be at least one ion selected from the group consisting of $Mg^{2+}$, $Ca^{2+}$, $Sr^{2+}$, $Ba^{2+}$, $Al^{3+}$, $Mn^{2+}$, $Fe^{3+}$, $Co^{2+}$, $Ni^{2+}$, and $Zn^{2+}$.

7 Claims, No Drawings

METHOD FOR FORMING AN ELECTRODE ON AN ELECTRONIC PART

CROSS REFERENCE TO RELATED APPLICATION

This is a continuation-in-part of Ser. No. 08/240,274 filed May 10, 1994 now abandoned.

BACKGROUND OF THE INVENTION

1. Field of the Invention

The present invention relates to a method for forming electrodes and, more particularly, to a method for forming an electrode on an electronic part made of ceramic such as chip parts, ceramic capacitors and active filters.

2. Description of the Prior Art

In the field of electronics, a higher degree of reliability of soldering technique, is strongly required through miniaturization of electronic parts, higher integration of printed circuits, finer pitching, automatization and higher speed of loading. Migration of silver used for external electrodes is likely to occur during soldering and there is now adopted a method of forming a nickel layer as barrier on the external electrodes for prevention of migration of silver. Also, covering the tin layer or solder layer by electrolytic plating, is adopted for prevention of bonding failure due to poor wettability of solder.

Also, a method of activating the electrodes by dipping it in a noble metal solution such as of palladium before electroless nickel plating, is usually used. Further, there is disclosed in Laid-open Application Publication No. 52827/1984 a method for covering and activating the electrodes by means of electrolessly plated palladium.

Also, for formation of a solder layer or a tin layer on a nickel plated surface by an electrolytic method, a method of activating the nickel plated surface by acid scouring immediately before the electrolytic plating is known.

However, since in the conventional method of forming a nickel layer, solder layer or tin layer by electrolytic plating, no plated layer can be formed unless under conditions allowing continuity, there is no degree of freedom with regard to the size and shape of the electronic parts to which the method is applicable. Furthermore, when there exist open terminals or short terminals in combination as a result of multiplication or multiple polarization of electronic parts, there results a marked variation of plating layer thickness. This tendency is marked especially with multi-polar network parts in which resistance (R), inductance (L) and capacitor (C) are conjugated.

Therefore, it is necessary to determine the electrolytically plating conditions itemwise, and this results in an increased manufacturing cost. In the future, the electrode interval is supposed to be narrower and the electrode size is supposed to be smaller, and these result in increased difficulty of determination of plating conditions.

Also, in order to establish electrodewise continuity in electrolytic plating such as nickel plating, tin plating and soldering, steel balls are put into the plating bath as media. When the steel balls and the electronic parts to be plated are stirred in the plating bath by means of a barrel and the like, minute cracks or chipping may result to affect the part's properties. Further, with multipolar parts, electrode's size is bound to decrease with decreasing part's size. Therefore, it is necessary to use still smaller steel balls in order to accomplish unfailing plating of such electrodes. However, when the steel balls used are too small compared with the electronic parts, the electronic parts are likely to flow up in the electrolytic plating bath off the steel balls, and this results in deterioration of the quality of the deposited layer. Also, this results in reduction and resulting deterioration of the electronic parts caused by the active hydrogen generated in the course of electrolytic plating.

Though there is disclosed in Laid-open Application Publication 52827/1984 tin plating or soldering by electrolytic or electroless plating, nothing is disclosed about concrete examples. Furthermore, there is disclosed in Laid-open Application Publication 52827/1984 electroless soldering bath using 3-valence titanium ion as reducing agent. But, when solder layer is formed on electroless nickel layer by said method with this plating bath, precipitation speed is slow and it is difficult to obtain solder layer having enough wettability of solder.

SUMMARY OF THE INVENTION

The main object of the present invention is to provide a method for formation of electrodes on given electronic parts with no necessity of determining the plating conditions itemwise, with less demerits such as reduction and resulting deterioration of electronic parts caused by electrolytic plating, and by which method, an electrode having enough wettability of solder is formed for an electronic part which needs soldering.

The method of the invention comprises a step of forming electrodes on a ceramic substrate, a step of dipping the ceramic substrate in a noble metal solution for activating the surface of the electrodes by the use of a noble metal and a step of forming a solder layer or a tin layer on the activated surface of the electrode by electroless plating using 3-valence titanium ion as reducing agent.

The electrodes to be formed on the ceramic substrate may be a double layer comprised of a first layer comprising silver, silver-palladium, silver-platinum or copper and a second electroless nickel plated layer. Preferably, the first layer is formed by thick film manufacturing process and the first layer is formed by baking process. In a step of forming a solder layer or a tin layer on the activated surface of said electrode by electroless plating using 3-valence titanium ion as reducing agent, it is preferable that metal ion except tin and lead is added in the plating bath. Preferably, the metal ion added in the plating bath may be alkali earth metal element or may be at least one ion selected from the group of $Mg^{2+}$, $Ca^{2+}$, $Sr^{2+}$, $Ba^{2+}$, $Al^{3+}$, $Mn^{2+}$, $Fe^{3+}$, $Co^{2+}$, $Ni^{2+}$, and $Zn^{2+}$.

A preferred example is a method for forming electrodes of an electronic part comprising a step of forming layer electrodes on a ceramic substrate, the electrodes being of silver, silver-palladium, silver-platinum or copper, a step of dipping the ceramic substrate in a solution of a noble metal for activation of the surface of the layer electrode, a step of forming electrolessly plated nickel layer on the surface of the activated layer electrode, a step of dipping the ceramic substrate in the solution of a noble metal for activating the surface of the electrolessly plated nickel layer by means of the noble metal and a step of forming a solder layer or tin layer by electrololoess plating using 3-valence titanium ion as reducing agent on the surface of the activated electrololeslly plated nickel layer.

The electrodes formed on the ceramic substrate is activated by a noble metal solution comprising gold, silver, platinum and the like, and by the subsequent electroless solder or tin plating the solder or tin plating are formed selectively and the layer thickness is uniformized, too.

More particularly, when the electrodes formed on the ceramic substrate are activated by the use of a noble metal solution comprising gold, silver, platinum and the like, the noble metal contained in the noble metal solution is less adsorbable to the ceramic substrate than to the electrodes thereon and by doing electroless plating of solder or tin, a solder layer or tin layer is selectively formed on the activated surface of electrodes. Meanwhile, since the plating layer is difficult to deposit, the insulation resistance between electrodes is not lowered.

Also, in electroless plating to obtain solder or tin plated layer, electroless plating bath with 3-valence titanium ion as reducing agent is used, and metal ion except tin and lead is added to improve precipitation speed. As added metal ion, $Mg^{2+}$, $Ca^{2+}$, $Sr^{2+}$, $Ba^{2+}$, $Al^{3+}$, $Mn^{2+}$, $Fe^{3+}$, $Co^{2+}$, $Ni^{2+}$, and $Zn^{2+}$ are effective, and alkali earth metal element is specially effective. As added metal ion, addition of only one kind is effective. However, addition of 2 kinds or more is effective, too.

Hence, according to the invention, there are much less demerits such as reduction and resulting deterioration of electronic parts caused by electrolytic plating. Also, since it is unnecessary to determine the plating conditions itemwise, the manufacturing cost of electronic parts can be reduced sizably. Furthermore, as precipitation speed of solder or tin plated layer is speedy and the layer is thickly plated, wettability of solder of an electronic part which needs soldering can be improved.

The aforementioned object, other objects, features, phases and merits will become more apparent from the following detailed description.

DESCRIPTION OF THE PREFERRED EMBODIMENTS

Embodiment 1

First, on a ceramic substrate with internal electrodes, capacitors and the like are formed therein, a silver paste is screen printed, this followed by baking of the silver paste, and then multi-terminal chip ceramic RC network parts are manufactured. Then, a given amount of the chip ceramic RC network parts is put into a barrel, and after degreasing by washing the loaded barrel is dipped for 5 minutes in the solution of palladium chloride for activating the electrodes thereon. Meanwhile, the electrodes may as well be formed using various metal pastes or by layer formation by means of vacuum technology such as sputtering or vapor deposition. For example, the electrode layer may be formed using nickel. Alternatively, the first electrode layer may be formed on the principal plane of ceramic substrate, the electrode layer being any of silver, silver-palladium or copper, and the second electrode layer of nickel on the principal plane of the first electrode layer may be used. The activation treatment may be done using an acidic or alkaline aqueous solution or a solution of organic matter, and similar result is obtained by the use of noble metal elements such as gold, silver and platinum instead of palladium.

Then, electroless nickel plating is done on the electrodes. Electroless nickel plating may be done using any of Ni-P plating with hypophosphite as reducing agent, Ni-B plating with borohydride, dimethyl amine boron and the like as reducing agent and nickel plating with hydradine as reducing agent, or multiple alloy plating on the basis thereof may as well be good.

After washing with pure water the electronic parts, the electronic parts are again dipped in palladium chloride solution for 5 minutes for activating nickel plated electrodes. Then the barrel with the electronic parts therein is put in the electroless tin plating bath added calcium chloride as follows to give tin plating of pH 7.0, 60° C., 60minutes.

| 3-sodium citrate | 0.34 mol/liter |
| --- | --- |
| ethylenediaminetetraacetic acid | 0.08 mol/liter |
| nitrilotriacetic acid | 0.20 mol/liter |
| stannous chloride | 0.08 mol/liter |
| calcium chloride | 0.013 mol/liter |
| titanium trichloride solution | 0.04 mol/liter |

The electronic parts are then washed with pure water and dried by hot blasting.

The tin layer of about 2.2 μm is precipitated on the plated electrodes of the electronic parts, and they show good wettability of solder. And, the precipitation of plated layer to the unactivated part is not found. Also, when the palladium activating treatment was omitted after electroless nickel plating, the precipitation of the tin layer is possible, but the precipitation speed of the tin layer was halved and samples with unlevelness in plated layer thickness were not seldom.

By the conventional method the plating conditions had to be determined itemwise, for each kind of electronic parts. Also, tin coating by the conventional method, it was impossible to keep the inter-terminal scattering of the layer thickness no less than 5 times. Further, chipping failure considered attributable to steel balls and deterioration of properties considered attributable to micro-cracking were inevitable.

While, after electroless plating, if electroless tin plating bath with 3-valence titanium ion as reducing agent is used, when calcium chloride is not added, the tin layer of about 1.2 μm was precipitated at the same condition, and soldering failure was inevitable.

Embodiment 2

The chip laminated ceramic capacitors treated in the same way as Embodiment 1 till electroless nickel plating, are dipped in palladium chloride solution for 5 minutes for activating nickel plated electrodes. Then the electronic parts are washed with pure water, and the barrel with the electronic parts therein is put in the electroless soldering bath added magnesium citrate as follows to give tin plating of pH 7.0, 65° C., 45minutes.

| 3-sodium citrate | 0.34 mol/liter |
| --- | --- |
| ethylenediaminetetraacetic acid | 0.08 mol/liter |
| nitrilotriacetic acid | 0.20 mol/liter |
| stannous chloride | 0.075 mol/liter |
| lead chloride | 0.005 mol/liter |
| magnesium citrate | 0.03 mol/liter |
| titanium trichloride solution | 0.04 mol/liter |

The electronic parts are then washed with pure water and dried by hot blasting.

The tin-lead layer of about 1.9 μm is precipitated on the plated electrodes of the electronic parts, and they show wettability of solder at least equal to electrolytic soldering. While, when magnesium citrate is not added, the tin layer of about 0.9 μm is precipitated at the same condition.

Embodiment 3

The chip volumes treated in the same way as Embodiment 1 till electroless nickel plating, are dipped in palladium chloride solution for 5 minutes for activating nickel plated electrodes. Then the electronic parts are washed with pure water, and the barrel with the electronic parts therein is put in the electroless tin plating bath added nickel chloride as follows to give tin plating of pH 7.0, 60° C., 60 minutes.

| 3-sodium citrate | 0.34 mol/liter |
| --- | --- |
| ethylenediaminetetraacetic acid | 0.08 mol/liter |
| nitrilotriacetic acid | 0.20 mol/liter |
| stannous chloride | 0.08 mol/liter |

| | |
|---|---|
| nickel chloride | 0.015 mol/liter |
| titanium trichloride solution | 0.04 mol/liter |

The electronic parts are then washed with pure water and dried by hot blasting.

The tin layer of about 2.6 μm is precipitated on the plated electrodes of the electronic parts, and the the tin layer is twice as thick as that in case nickel chloride is not added. And, nickel component is not detected from obtained tin plated layer.

Although the present invention has been described in detail, it is apparent that they are for description of an example and not to be taken as limitation, and the spirit and scope of the invention is limited only by the wording of the appended claims.

What is claimed is:

1. A method for forming electrodes on an electronic part comprising the steps of:

forming electrodes on a ceramic substrate, dipping said ceramic substrate in a noble metal solution for activating surfaces of said electrodes by the use of a noble metal, and forming a solder layer or a tin layer on said activated surfaces of said electrodes by electroless plating using a trivalent titanium ion as a reducing agent;

wherein in the step of forming a solder layer or a tin layer on said activated surfaces of said electrodes, a metal ion other than tin and lead is added in a plating bath; and wherein said metal ion added in the plating bath is at least one metal ion selected from the group consisting of $Mg^{2+}$ and $Ca^{2+}$.

2. A method for forming electrodes on an electronic part according to claim 1, wherein the electrodes on said ceramic substrate are composed of a first layer of silver, silver-palladium, silver-platinum or copper and a second layer of electrolessly plated nickel.

3. A method for forming electrodes on an electronic part according to claim 2, wherein said first layer is formed by screen printing.

4. A method for forming electrodes on an electronic part according to claim 3, wherein said first layer is baked.

5. A method for forming electrodes on an electronic part comprising the steps of:

forming a layer electrode on a ceramic substrate, said electrode being of silver, silver-palladium, silver-platinum or copper, dipping said ceramic substrate in a solution of a noble metal for activation of a surface of said layer electrode, forming an electrolessly plated nickel layer on the surface of said activated layer electrode, dipping said ceramic substrate in the solution of a noble metal for activating the surface of said electrolessly plated nickel layer by means of said noble metal, and forming a solder layer or tin layer by electroless plating using a trivalent titanium ion as a reducing agent on the surface of said activated electrolessly plated nickel layer;

wherein in the stem of forming a solder layer or tin layer on the surface of said activated electrolessly plated nickel layer, a metal ion other than tin or lead is added in a plating bath; and wherein said metal ion added in the plating bath is at lest one metal ion selected from the group consisting of $Mg^{2+}$ and $Ca^{2+}$.

6. A method for forming electrodes on an electronic part according to claim 5, wherein said layer electrode is formed by screen printing.

7. A method for forming electrodes on an electronic part according to claim 6, wherein said layer electrode is baked.

* * * * *